(12) United States Patent
Ohashi et al.

(10) Patent No.: US 6,291,311 B2
(45) Date of Patent: Sep. 18, 2001

(54) SEMICONDUCTOR DEVICE AND METHOD FOR PRODUCING SAME

(75) Inventors: Takuo Ohashi; Tomohisa Kitano, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/764,055

(22) Filed: Jan. 19, 2001

Related U.S. Application Data

(62) Division of application No. 09/321,885, filed on May 28, 1999, now Pat. No. 6,214,700.

(30) Foreign Application Priority Data

| Jun. 1, 1998 | (JP) | 10-151600 |
| Oct. 9, 1998 | (JP) | 10-287402 |

(51) Int. Cl.$^7$ ............................................. H01L 21/76
(52) U.S. Cl. .................... 438/439; 438/225; 438/297; 438/424; 438/435
(58) Field of Search ....................... 438/225, 297, 438/424, 435, 439, 450

(56) References Cited

U.S. PATENT DOCUMENTS

| 5,821,153 | * | 10/1998 | Tsai et al. | 438/439 |
| 5,869,405 | | 2/1999 | Gonzalez et al. | |
| 5,958,505 | * | 9/1999 | Mantl | 438/439 |
| 6,087,241 | * | 7/2000 | St Amand et al. | 438/439 |

FOREIGN PATENT DOCUMENTS

| 000671760 A2-A2 | * | 9/1995 | (EP) | H01L/21/265 |
| 5275299 | | 10/1993 | (JP) | . |
| 11135614 | * | 5/1999 | (JP) | H01L/21/76 |

* cited by examiner

Primary Examiner—Charles Bowers
Assistant Examiner—David S. Blum
(74) Attorney, Agent, or Firm—McGinn & Gibb, PLLC

(57) ABSTRACT

On the surface of a field oxide film (3 of FIG. 2e) formed on a substrate region where the effective thickness in the vertical direction of a substrate is diminished due to the presence of a crystal defect (2 of FIG. 1a), the field oxide film is etched by a predetermined thickness until a recess (4 of FIG. 2f) ascribable to the presence of the defect is exposed (step of FIG. 2f). A new oxide film then is formed in an amount corresponding to the above-mentioned thickness on the field oxide film (step of FIG. 3g) to diminish the depth of the recess ascribable to the presence of the defect. To provide a semiconductor device in which leakage between elements can be eliminated with a thin LOCOS oxide film thickness remaining unchanged.

8 Claims, 14 Drawing Sheets

18 AMOUPHOUS LAYER

1 SUBSTRATE
2 CRYSTAL DEFECT
12 OXIDIZED FILM
13 NITRIDE FILM

3 FIELD OXIDE FILM
4 RECESS BY CRYSTAL DEFECT

5 THICKEN FIELD OXIDE FILM
6 IMPLANTING CHANNEL STOPPER
7 IMPLANTING FOR DIFFUSION LAYER
14 CHANNEL STOP LAYER
16 DIFFUSION LAYER

10 OXIDE LAYER
IN CRYSTAL DEFECT

17 SIDE WALL

18 AMOUPHOUS LAYER

SEMICONDUCTOR DEVICE AND METHOD FOR PRODUCING SAME

The present application is a divisional application of U.S. patent application Ser. No. 09/321,885, filed on May 28, 1999 now U.S. Pat. No. 6,214,700.

FIELD OF THE INVENTION

The present invention relates to a semiconductor device and a method for producing same. More particularly, it relates to a semiconductor device of high quality having a high element-to-element voltage withstanding properties, and a method for producing therefor.

BACKGROUND

Referring to the drawings, a conventional method for producing a semiconductor device is explained. FIGS. 10 to 12 show cross-sectional views for illustrating the conventional method for producing a semiconductor device step-by-step. FIGS. 10 to 12 are fractionated for convenience of the drawing.

Referring to FIGS. 10 to 12, a thermally oxidized film 12 is formed on a silicon substrate 1 to a thickness of 10 nm (FIG. 10b), and a nitride film 13 is deposited thereon to a thickness of 120 nm (FIG. 10c). This nitride film 13 is patterned to a field pattern, using a known lithographic technique (FIG. 11d). The resulting assembly is thermally oxidized at 980° C. to form a field oxide film 3 to a thickness not less than 400 nm (FIG. 11e).

The nitride film 13 then is removed and the oxide film 12 beneath the nitride film 13 also is removed. Then, boron 6 is implanted on the entire wafer surface at an acceleration energy of 100 kev at a doze of $1 \times 10^{12}$ to form a channel stop layer 14 (FIG. 12g).

Here, the field oxide film is explained. For a semiconductor device formed on the semiconductor substrate, local oxidation of silicon (LOCOS) is routinely used for device isolation. However, as the device size becomes finer, the device region is reduced, such that bird's beak like defects (termed as "bird's beak" herein) at LOCOS ends tends to affect the device region to an increasing extent. Since the bird's beak at the LOCOS end can be reduced by reducing the LOCOS film thickness, the LOCOS is recently reduced in thickness and is formed to a thickness on the order of 300 nm.

SUMMARY OF THE DISCLOSURE

However, in the course of the investigations toward the present invention the following problems have been encountered. Namely, if, with the above-described conventional method for producing for the semiconductor device, crystal defects 2 (voids) are contained in a field oxide film 3, the portion of the implanted crystal defect is exposed, due to subsequent etching of the oxide film 12 by general tens of nm, to produce a recess 4 in the field oxide film 3 due to the crystal defect. In this portion of the recess 4, the film thickness of the field oxide film 3 is thinner than the other portions of the field oxide film 3 by an amount corresponding to the crystal defect 2.

If, in this state, implanting for the channel stop layer 6 is performed at 6 by the field-through method, the channel stop layer is implanted below the field of the recess 4 in a deeper depth the case without recess, such that boron is not implanted sufficiently directly below the field. Thus, a low concentration region of channel stop layer 19 is produced.

If an impurity 7 then is implanted (doped) for forming a source/drain diffusion layer, the impurity is implanted into the bulk of the substrate below the field oxide film 3 into which the impurity inherently is not (to be) implanted, that is into the low concentration region of channel stop layer 19, in the reduced film thickness portion of the field oxide film 3 produced due to the recess 4 ascribable to the crystal defect, thus yielding an inverted layer 20. Since leakage of electrical charges occurs via this inverted layer 20, element-to-element (generally termed as "inter-element") voltage withstanding properties are lowered, thus producing reject products.

The reject products are liable to be produced as the film thickness of the field oxide film 3 is reduced with size refinement of the element and are produced most frequently in products having a minimum design rule of 0.35 µm (or less). It is noted that the larger the number of substrate pits ascribable to voids in the device isolation area per chip of the semiconductor device at the time of wafer delivery, that is the number of crystal originated particles (COP), the more likely is the inter-element leakage defect to be produced. Thus, for prohibiting the inter-element leakage defect from occurring, it becomes necessary to use crystals with a smaller number of the COP at the time of wafer delivery, or to develop a method for producing which possibly alleviate the effect of substrate pits.

In view of the above-described deficiency in the prior art, it is an object of the present invention to provide a semiconductor device whereby the inter-element leakage can be eliminated while the thin LOCOS oxide film thickness is maintained.

It is another object of the present invention to provide a method for producing such a semiconductor device.

For accomplishing the above object, the present invention provides semiconductor devices and methods according to various aspects. Particularly, according to a first aspect of the present invention there is provided a semiconductor device characterized in that an oxide film for device isolation, formed on a region of a substrate where the effective thickness in the vertical direction of the substrate is decreased due to the presence of a defect, is etched by a predetermined thickness until a recess ascribable to the presence of the defect is exposed, and that subsequently a new oxide film is formed on the first-stated oxide film in an amount corresponding to the predetermined thickness.

In the semiconductor device according to the present invention, an amorphousized portion is formed by implantation of pre-set ions in a portion of a substrate region destined for forming an oxide film for device isolation where the effective thickness in the vertical direction of the substrate is diminished by the presence of a defect.

According to another aspect of the present invention, there is provided a novel method for producing a semiconductor device. The method comprises: etching off the surface of an oxide film for device isolation, formed on a region of a substrate where the effective thickness in the vertical direction of the substrate is decreased due to the presence of a defect, by a predetermined thickness, until a recess ascribable to the presence of the defect is exposed ; and newly forming anoxide film on the first-stated oxide film in an amount corresponding to the predetermined thickness to diminish the depth of the recess ascribable to the presence of the defect.

Also, according to a third aspect, there is provided a method for producing a semiconductor device. In the method, ion implantation may be carried out divisionally a plural number of times when implanting ions for forming a channel stoplayer in a portion of the substrate including the substrate portion directly below the oxide film for device isolation. Thus, when implanting ions for forming the channel stop layer, the ions are caused to travel beyond the maximum film thickness portion of the oxide film for device isolation at the time of initial ion implantation to form a first channel stop and, for next and subsequent ion implantation, a second channel stop layer is formed to overlie the recess of the first channel stop layer in register with the recess of the oxide film for device isolation.

According to a fourth aspect, there is provided another method for producing a semiconductor device. In the method, the predetermined thickness of etching off the oxide film for device isolation is preferably set to a value which does not permit ion flight to a substrate portion directly below the oxide film for device isolation at the time of ion implantation for forming an impurity layer following the formation of the new oxide film on the first-stated oxide film in an amount corresponding to the predetermined thickness.

Also, in a method according to a further aspect of the present invention, inter-lattice oxygen in a substrate is captured in a defect in the substrate by heat-treating the substrate. The defect size can be decreased by uplifting the crystal at a pre-set velocity at the time of growth of a monocrystal used for the substrate.

In addition, in a method according to a still further aspect of the present invention, predetermined ions are implanted in a center region of an oxide film for device isolation excluding an end portion destined to be a possible bird's beak to amorphousize the substrate, and the oxide film for device isolation is subsequently formed to increase the oxide film thickness only in a center region of an oxide film for device isolation.

BRIEF DESCRIPTION OF THE INVENTION

FIGS. 1(a) to (c) is a cross-sectional view for illustrating the manufacturing process of a first Example of the present invention, step-by-step.

FIGS. 2(d) to (f), continuing to FIG. 1, is a cross-sectional view for illustrating a manufacturing process of the first Example of the present invention, step-by-step.

FIGS. 3(g) to (i), continuing to FIG. 2, is a cross-sectional view for illustrating the manufacturing process of the first Example of the present invention, step-by-step.

FIGS. 4(a) to (c) is a cross-sectional view for illustrating a manufacturing process of the second Example of the present invention, step-by-step.

FIGS. 5(a) to (c) is a cross-sectional view for illustrating a manufacturing process of the third Example of the present invention, step-by-step.

FIGS. 6(d) to (f), continuing to FIG. 5, is a cross-sectional view for illustrating a manufacturing process of the third Example of the present invention, step-by-step.

FIGS. 7(a) to (c) is a cross-sectional view for illustrating a manufacturing process of the fourth Example of the present invention, step-by-step.

FIGS. 8(a) to (c) is a cross-sectional view for illustrating a manufacturing process of the fifth Example of the present invention, step-by-step.

FIGS. 9(d) to (f), continuing to FIG. 8, is a cross-sectional view for illustrating the manufacturing process of the fifth Example of the present invention, step-by-step.

FIGS. 10(a) to (c) is a cross-sectional view for illustrating a conventional manufacturing process of a semiconductor device.

FIGS. 11(d) to (f), continuing to FIG. 10, is a cross-sectional view for illustrating the conventional manufacturing process of the semiconductor device.

FIGS. 12(g) to (h), continuing to FIG. 11, is a cross-sectional view for illustrating the conventional manufacturing process of the semiconductor device.

PREFERRED EMBODIMENTS OF THE INVENTION

In a present embodiment of the method for producing a semiconductor device according to the present invention, it is concerned with the surface of a field oxide film (3 in FIG. 2(e) which is formed in a region on a substrate, in which region the effective thickness of the substrate along the perpendicular direction is reduced due to the presence of the crystal defect (2 in FIG. 1a). The field oxide film is etched a predetermined thickness until a recess (4 of FIG. 2f) ascribable to the presence of the defect is exposed (step of FIG. 2f) on the surface of the field oxide film. A new oxide film then is formed by the above-mentioned thickness on the field oxide film (step of FIG. 3g) to diminish the depth of the recess ascribable to the presence of the defect.

EXAMPLE

For more specifically illustrating the above-mentioned embodiment of the present invention, illustrative Examples of the present invention will be hereinafter explained with reference to the drawings.

Example 1

Figure 1:
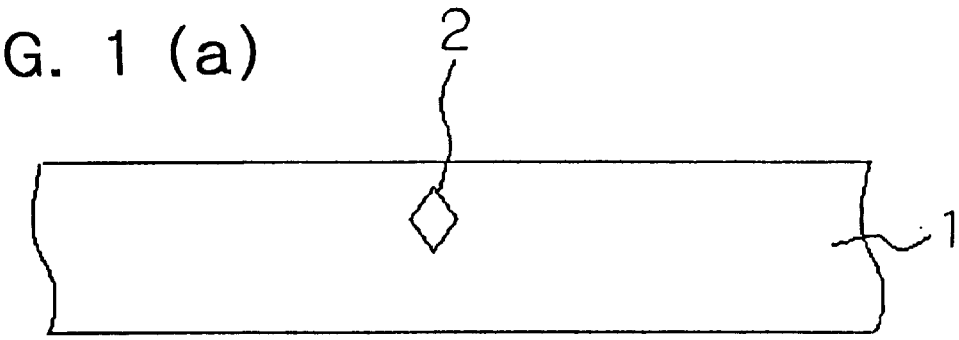
Figure 1:
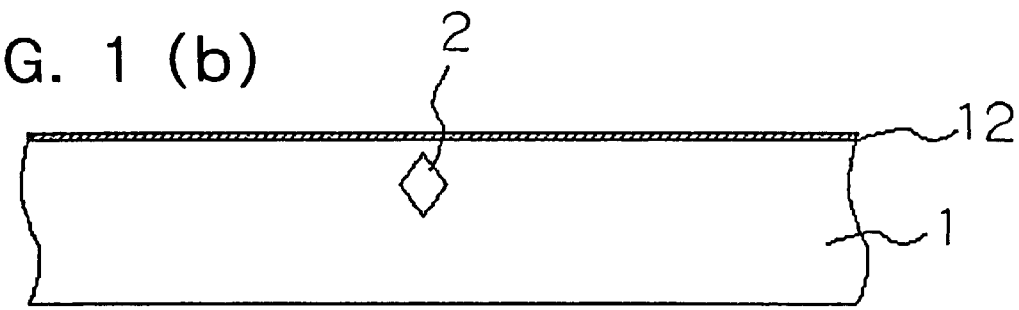
Figure 1:
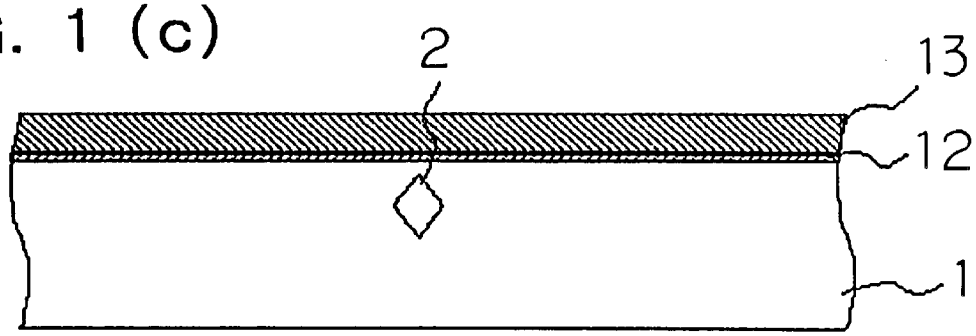
Figure 2:
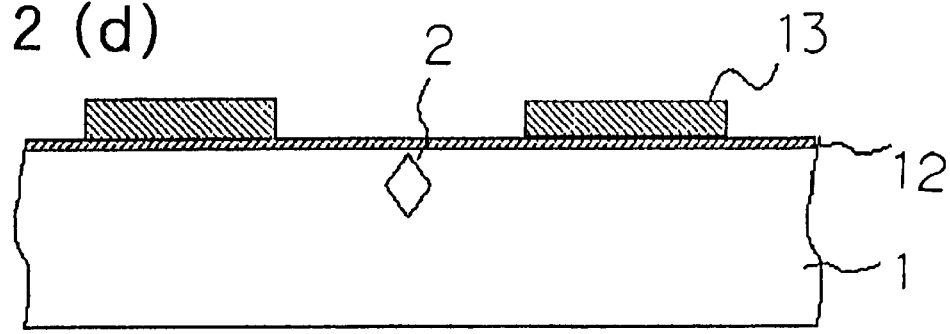
Figure 2:
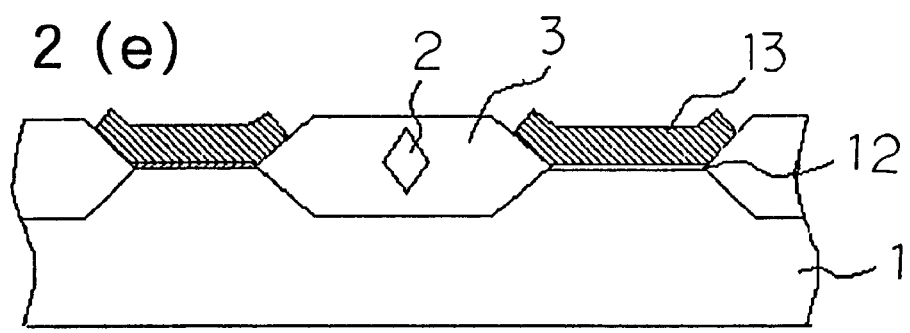
Figure 2:
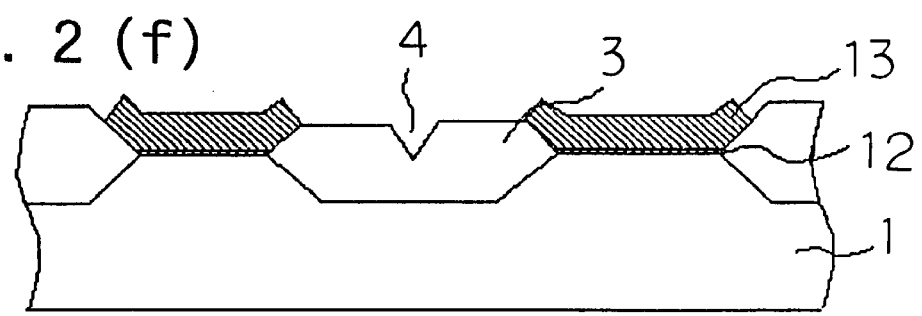
Figure 3:
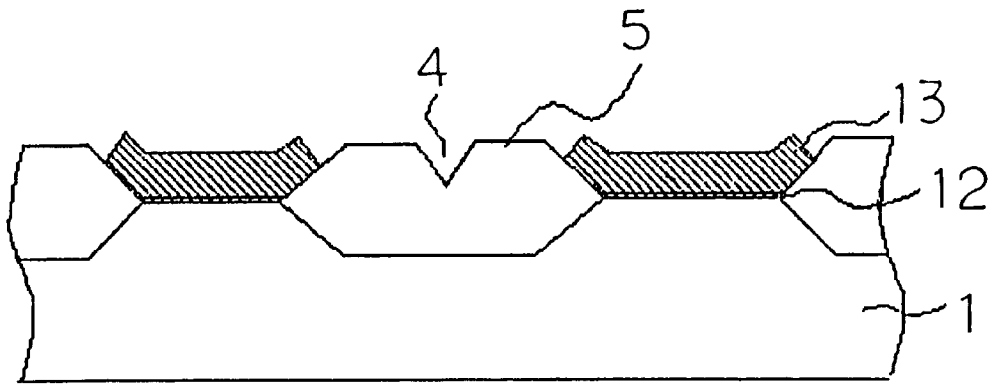
Figure 3:
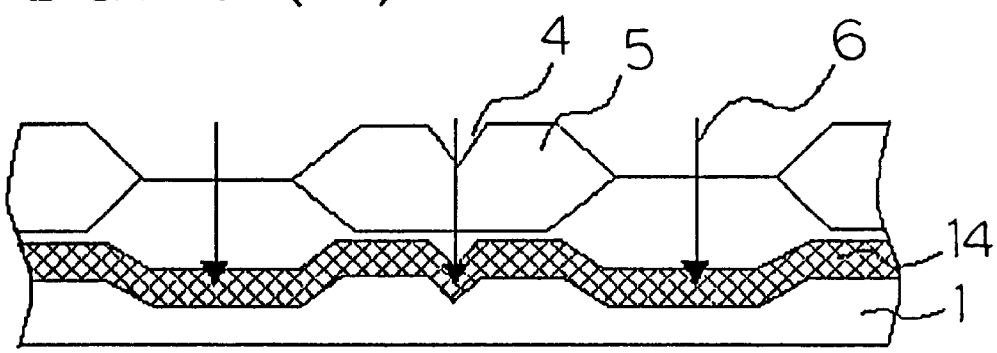
Figure 3:
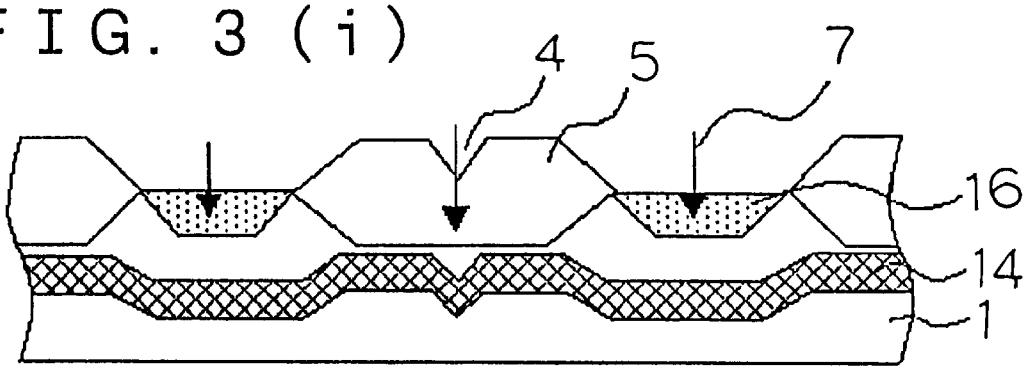

Referring to FIGS. 1 to 3, the first Example of the present invention is explained. FIGS. 1 to 3 are cross-sectional views for illustrating, step-by-step, a method or producing the semiconductor device according to the first Example of the present invention.

Referring to FIGS. 1 to 3, a silicon substrate 1, manufactured by slicing an ingot produced by crystal growth by the Czochralski (Cz) method is provided (FIG. 1a). This silicon substrate 1 has crystal defects (voids) ascribable to vacant pores.

Then a thermally oxidized film 12, with a thickness of 10 nm (FIG. 1b) and a nitride film 13, with a thickness of 120 nm (FIG. 1c), are grown in this order. This nitride film 13 is dry-etched to a field pattern, using known lithographic and etching techniques (FIG. 2d). The field oxide film (LOCOS) 3 then is formed by thermal oxidation to a thickness of 300 nm (FIG. 2e).

The oxide film then is etched by a thickness of the order of 100 nm, as shown in FIG. 2c, to produce intentionally a recess 4 as a crystal defect 2 of 100 to 200 nm in size, captured in the field oxide film 3. Then, field oxidation is again performed to a thickness of 100 nm, as shown in FIG. 3g.

It is noted that the oxide film is etched at a higher rate in a region to which an etching solution is supplied abundantly, while it is etched at a lower rate in a region where the etching solution is stagnant. Thus, the recess 4 is etched at a lower rate than in other portions of the field oxide film 3, so that the recess 4 becomes shallower as etching progresses. On the other hand, in the field oxidation, the oxide film is formed at a higher rate in the recess 4 than in other portions of the field oxide film 3, so that the recess 4 becomes shallower as etching proceeds, as in the case of etching. Therefore, the effective depth of the recess 4 can be reduced by carrying out the etching and re-oxidation.

After increasing the film thickness of the field oxide film in this manner, boron 6 for channel stop layer is implanted under the condition of an acceleration energy of 100 kev and a dosage of $1 \times 10^{12}$. Then P or As is implanted for forming a source/drain diffusion layer 16.

For producing a p-channel (termed as "p-ch") transistor, the process similar to that described above is carried out, except that B or $BF_2$ is used as an element implanted for forming the source/drain layer 16 of the p-ch transistor. A similar method is used for forming n-ch or p-ch transistor on a n-type Si substrate.

In the above method, the field oxide film 3 has, prior implanting for the channel stop layer, has an oxide film least 100 nm in thickness in the region of the recess 4, caused by the crystal defect 2, while having an oxide film remaining at 300 nm, as before, due to oxide film etching and re-oxidation, in regions other than the recess 4. Therefore, there is no risk of enlargement of the bird's beak at the LOCOS end.

It is noted that the thickness of the oxide film at the recess 4 needs to be thicker than the average range distance (Rp) of implantation aimed at forming the source/drain diffusion layer 16. The reason is that, since field oxide film through implantation is effectuated at the time of implantation for the formation of the source/drain diffusion layer 16, implantation is into the bulk of the silicon substrate 1 below the field if the film thickness of the field oxide film 3 in the region of the recess 4 is thinner than Rp for source/drain implantation, with a result that an inverted layer is produced in the channel stop region 1.

However, in the present embodiment, there is no risk of formation of the low concentration region of channel stop layer below the field, despite the oxide film etching by several tens of nm after the time of formation of the field oxide film 3 until channel stop implantation and the implantation at the time of formation of the source/drain diffusion layer. This is because the field oxide film is of sufficient thickness by the second oxidation.

Example 2

Figure 4:
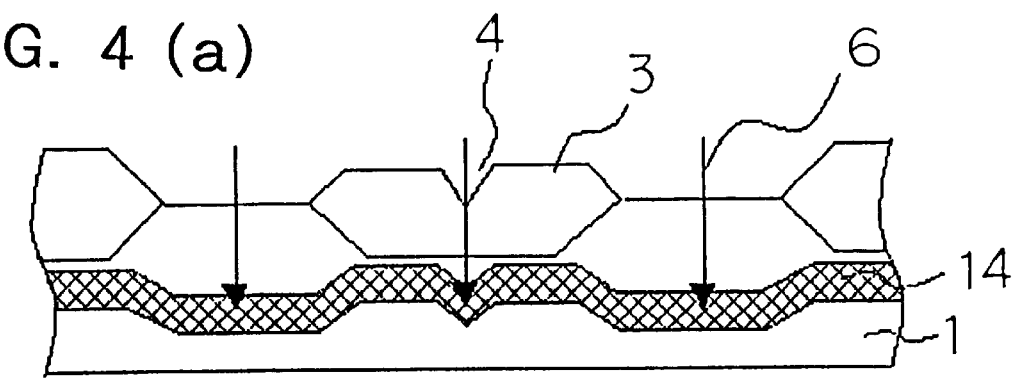
Figure 4:
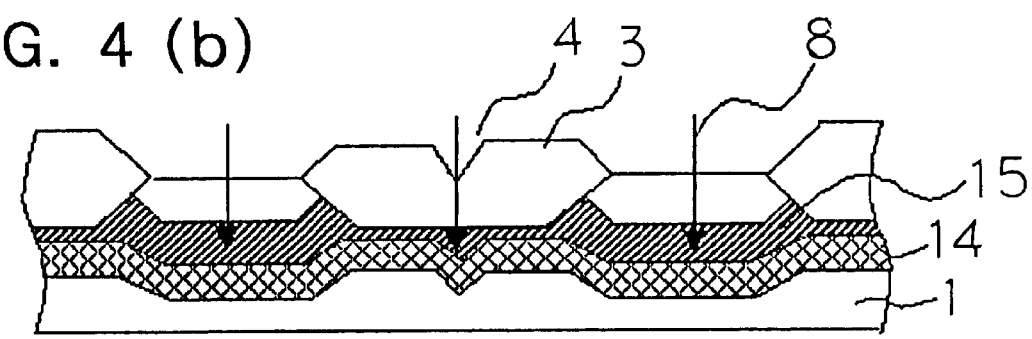
Figure 4:
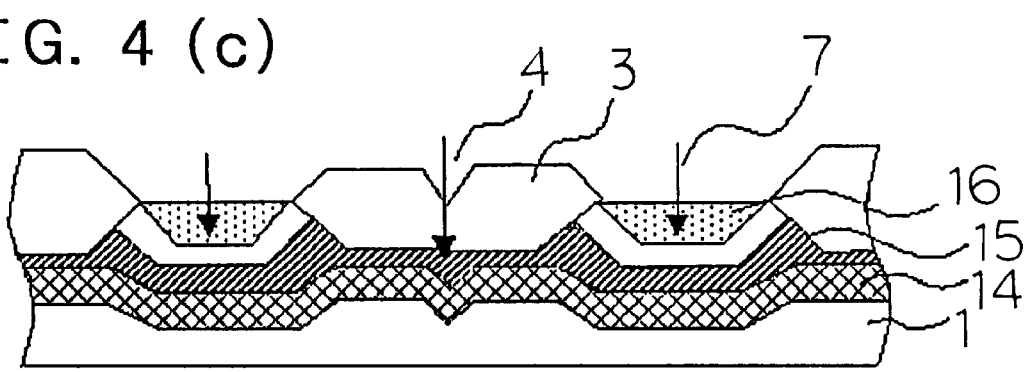

Referring to FIG.4, a second Example of the present invention is explained in detail. FIG. 4 is a cross-sectional view for illustrating, step-by-step, a portion of the method for producing of the semiconductor device according to the second Example of the present invention.

The principal difference of the second Example from the above-described first Example is that second formation of the oxide film is not carried out following the etching of the oxide film for exposing the crystal defect in the field oxide film in the process of FIG. 2f, and that channel stop implantation is carried out as a two-step process. Therefore, in the present Example, the process steps from FIG. 1a to FIG. 2f explained in the first Example are used for manufacture.

Referring to FIG. 4 for illustrating the feature of the present invention, a semiconductor device, manufactured in the same way as in Example 1 up to the step of FIG. 2f, boron for the channel stop layer is implanted by setting the energy so that the average range Rp for implantation will be larger than the field oxide film (FIG. 4a). A second channel stop implantation then is carried out under a lower energy condition than in the first channel stop implantation (FIG. 4b).

In this case, even if the low concentration region of channel stop layer is formed in the bulk of the silicon substrate directly below the recess 4 in the field oxide film 3 due to the crystal defect 2 (void) ascribable to the vacant pore, the low concentration region of channel stop layer can be "reinforced" (replemished) by the second channel stop implantation, so that there is no risk of formation of the low concentration region of channel stop layer.

The reason is that the second channel stop implantation is effectuated under the condition of a lower energy than the first channel stop implantation, so that the impurity is implanted in a portion shallower than in the first channel stop implantation. In a field where there is not formed the recess, Rp in the second implantation is set within the field oxide film, so that implanted atoms are trapped in the field oxide film, with the channel being formed only by the first implantation. Therefore, there is no formation of the low concentration region of channel stop layer under the field by the second channel stop implantation even in the field where there is not formed the recess.

Example 3

Figure 5:
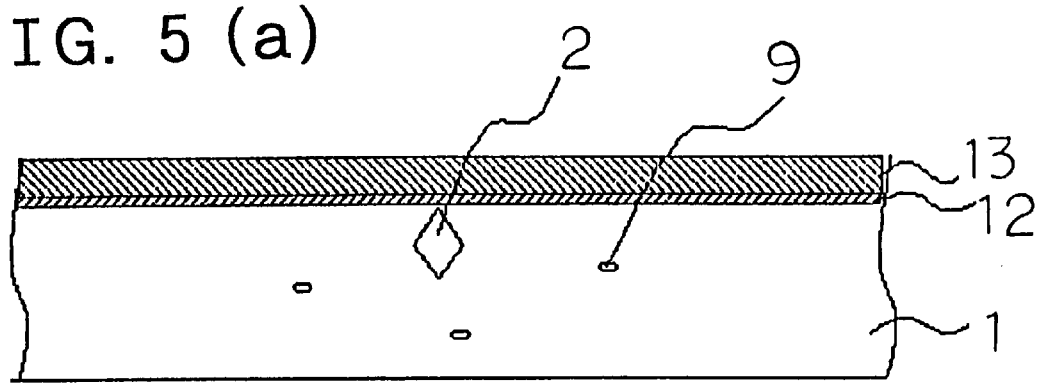
Figure 5:
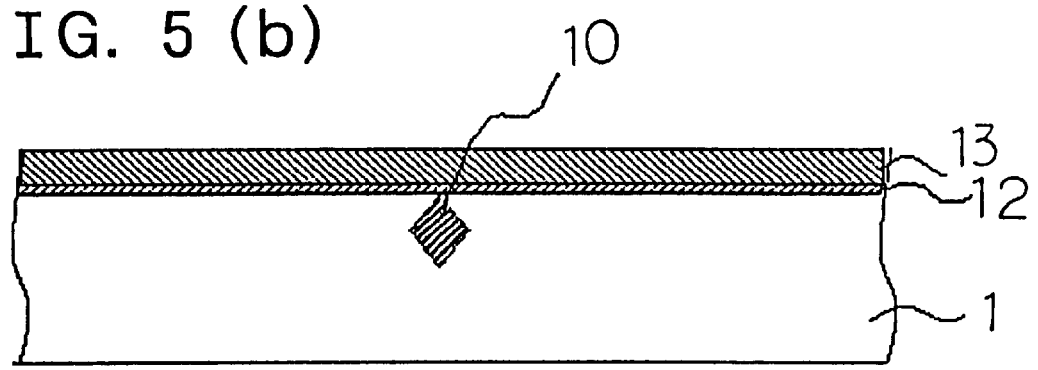
Figure 5:
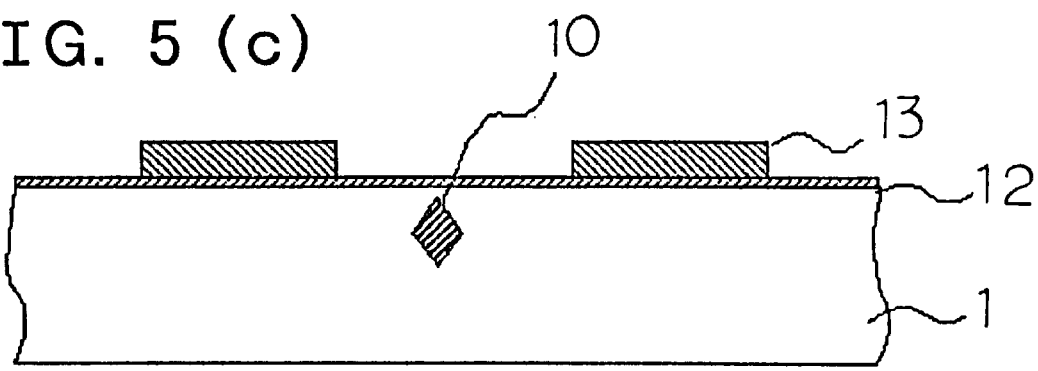
Figure 6:
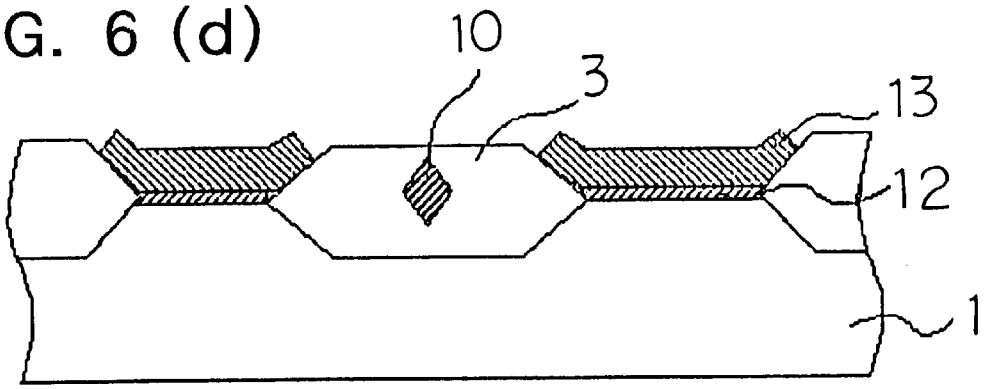
Figure 6:
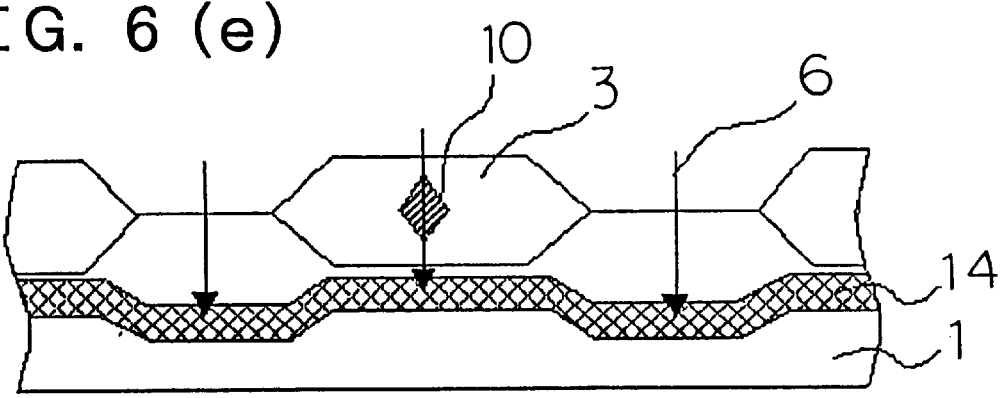
Figure 6:
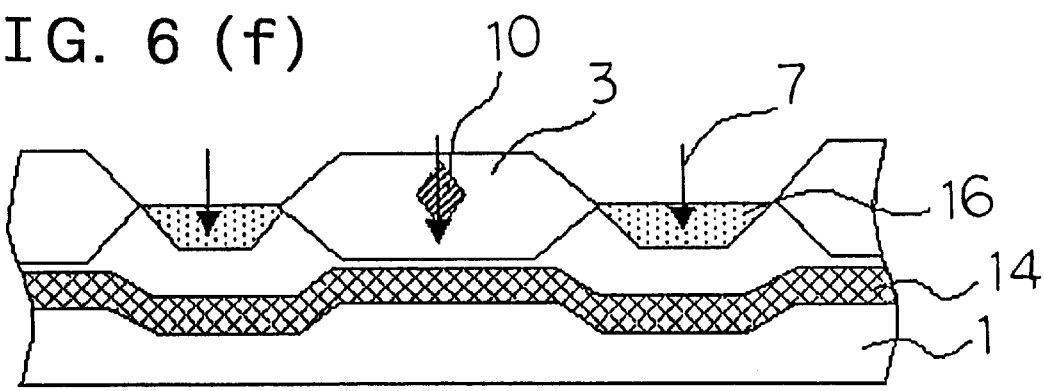
Figure 13:
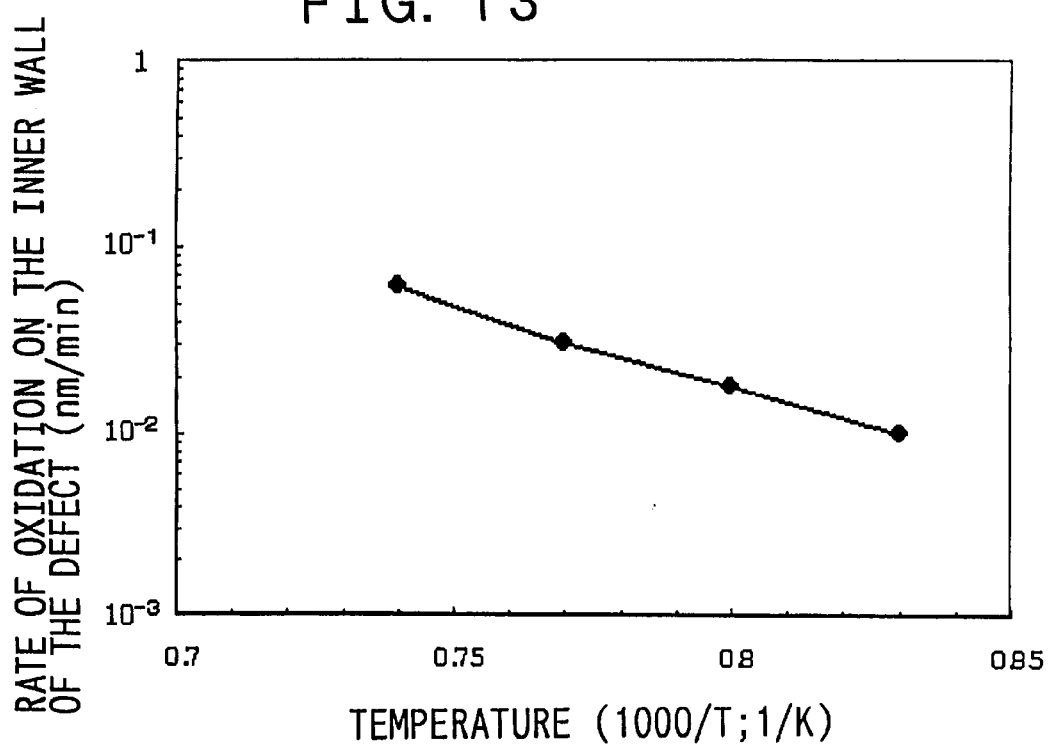
FIG. 13 shows the temperature dependency of the diffusion coefficient of inter-lattice oxygen atoms in a silicon crystal.

Referring to FIGS. 5, 6 and 13, a third Example of the present invention is explained in detail. FIGS. 5 and 6 are cross-sectional views for illustrating, step by step, a portion of the manufacturing process for the semiconductor device according to the third Example of the present invention. FIG. 13 illustrates the relation between the rate of oxidation on the inner wall of the crystal defect and the temperature.

The principal difference of the present third Example from the previously described fist Example is that the defect is buried (impregnated) with oxygen by annealing the crystal defect formed in a silicon substrate in a gaseous atmosphere. Therefore, in the present Example, the same process steps as those of the first Example are used from FIG. 1a to FIG. 1c.

The main points of the present Example are explained with reference to FIGS. 5 and 6. A semiconductor device, manufactured in the same way as in the above-described first Example up to the step of FIG. 1c, is heat-treated at an elevated temperature of 1100° C. for five hours in a nitrogen atmosphere. By this heat treatment, oxygen atoms in the silicon crystal are diffused into the crystal to undergo the oxidating reaction in the defect 2 to form an oxide layer on the inner wall of the defect 2 (FIG. 5a). Thus, the defect 2 is charged with an oxide layer (FIG. 5b).

The nitride film 13 then is dry-etched into a field pattern, using known lithographic and etching techniques (FIG. 5c) to form a field oxide film 3 to a thickness of 300 nm (FIG. 6d). Since the inner wall of the defect 2 is sufficiently small by the charged oxide layer, there is no risk of the recess 4 being formed in the field oxide film 3 even if the oxide film is etched subsequently.

Therefore, the low concentration region of channel stop layer is not formed beneath the field oxide film 3, despite field-through channel stop implantation at 6 (FIG. 6e) thus prohibiting leakage from one to another element (i.e., inter-element leakage). A diffusion layer then is formed by implantation for the formation of the source/drain diffusion layer.

The high-temperature heat treatment under a nitrogen atmosphere, shown in FIG. 5a, can be carried out by the process other than that shown in FIG. 5a. For example, the heat treatment can be effected immediately following the formation of a pad oxide film (the step of FIG. 1b) or immediately following the dry etching of the nitride film (the step of FIG. 5c). That is, it suffices if the inner wall of the crystal defect 2 is charged with the oxide layer at the time of formation of the field oxide film 3 and if high-temperature heat treatment is effected at a certain time until the timing of the field oxidation.

It is noted that the rate of growth of the oxide film on the inner wall of the crystal defect is governed by the inter-lattice oxygen diffusion across the lattices. In general, the field oxide film is decreased in film thickness by approximately 100 nm due to the crystal defect 2 in the silicon substrate 1 ascribable to the inter-element leakage. In this case, the inter-element leakage can be eliminated by reducing the crystal defect 2 by 100 nm, such that it suffices if an oxide layer of 50 nm is formed on the inner wall of the crystal defect.

Reference is had to this end to FIG. 13 showing the relation between the rate of oxidation of the inner wall of the defect and the temperature. If heat treatment is carried out at 1100° C., the rate of oxidation of the oxidized layer on the inner wall is on the order of 0.1 nm/min. Thus, heat treatment for eight hours is required to form the oxidized layer on the inner wall of 50 nm. Similarly, the rate of oxidation at 1200° C. is on the order of 0.2 nm/min, so that heat treatment for four hours suffices. On the other hand, the rate of oxidation at 1050° C. is on the order of 0.05 nm/min, so that heat treatment for 16 hours is required. The heat treatment is preferably carried out at 1100° C. or higher since excessively long heat treatment time is not desirable for reducing the number of process steps.

Example 4

Figure 7:
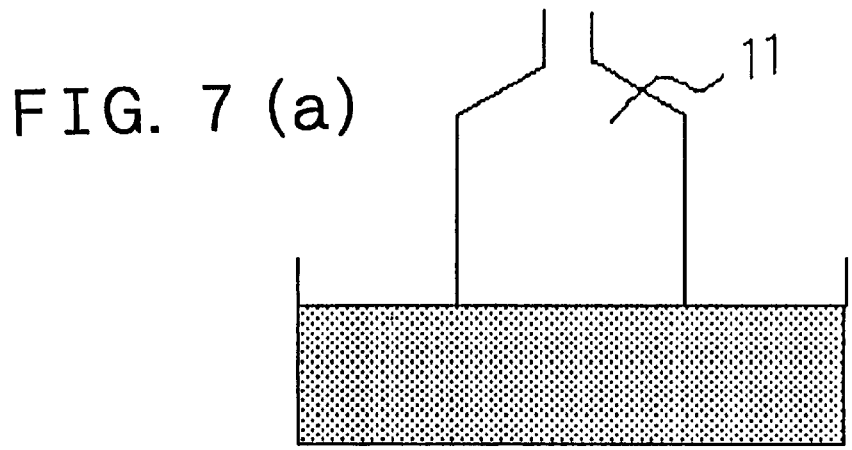
Figure 7:
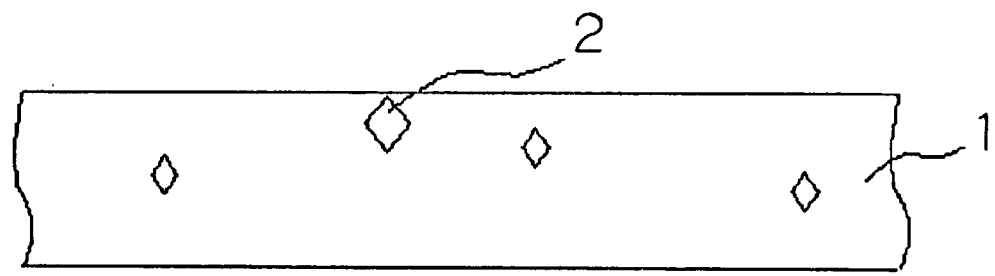
Figure 7:
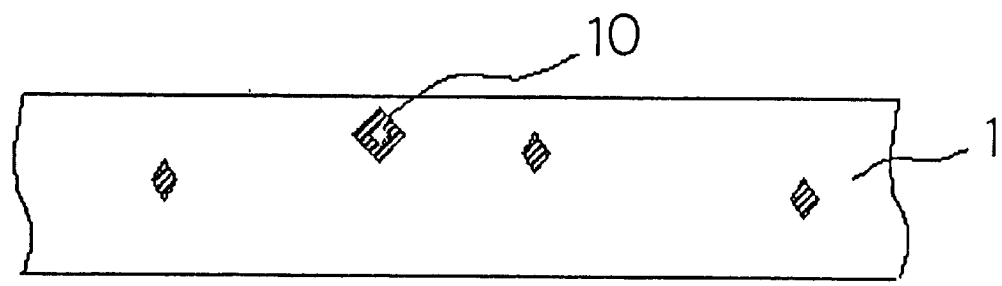
Figure 14:
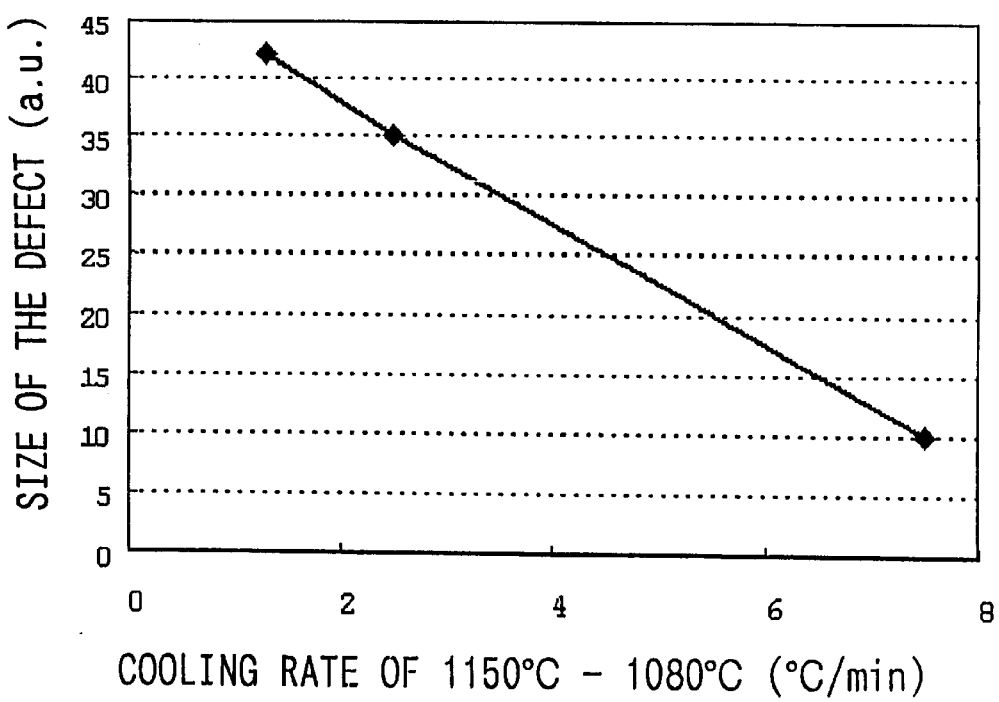
FIG. 14 shows the cooling rate dependency of the crystal defect size.
Figure 15:
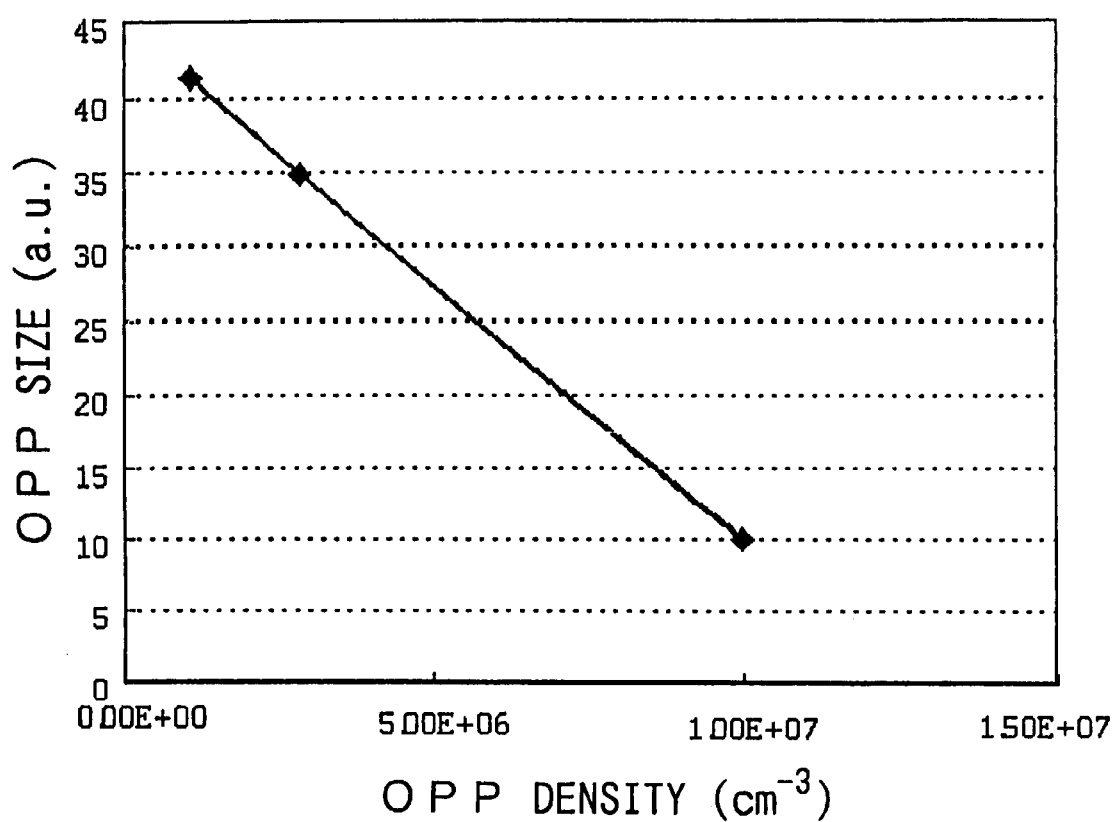
FIG. 15 shows the relation between the crystal defect size (arbitrary unit) and the defect density as measured by OPP.

Referring to FIGS. 7, 14 and 15, a fourth Example of the present invention is explained. FIG. 7 is a cross-sectional view for illustrating, step-by-step, a portion of the method for producing for a semiconductor device according to the fourth Example of the present invention. FIG. 14 illustrates a defect contained in the bulk of the substrate of the semiconductor device according to the fourth Example of the present invention, and FIG. 15 illustrates the relation between the size and the density of the crystal defect.

The main difference of the fourth Example from the previously explained third Example is that the condition of crystal growth is improved to reduce the size of the crystal defect.

Referring to FIGS. 14 and 15, it is seen that, by raising the cooling rate in the vicinity of 1080° C. to 1150° C. in the cooling process at the time of uplifting a silicon crystal ingot, flocculation of crystal defects can be suppressed to reduce the size of the crystal defect. Preferably, the cooling rate in the vicinity of 1080° C. to 1150° C. is set to 2.5° C./min or higher to reduce the defect size sufficiently. In this case, the low concentration region of channel stop layer is not formed under the field in the absence of high-temperature heat treatment, whereas, if heat treatment is carried out at an elevated temperature, the heat treatment time can be reduced further.

Example 5

Figure 8:
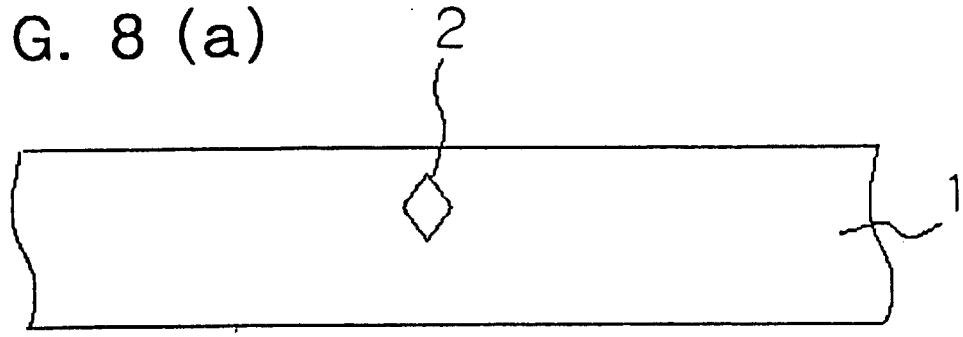
Figure 8:
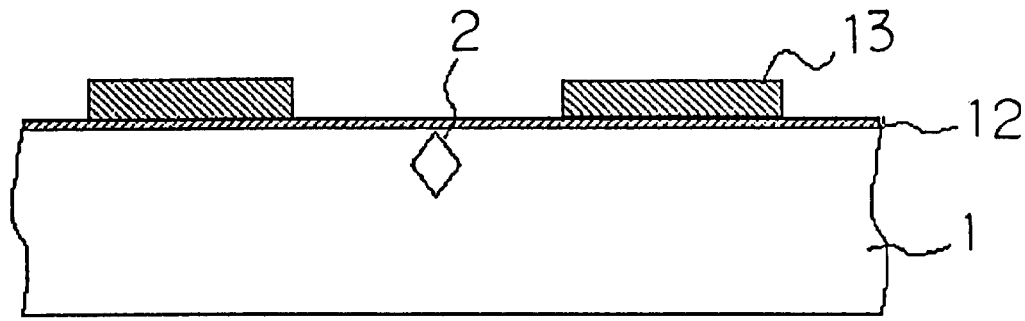
Figure 8:
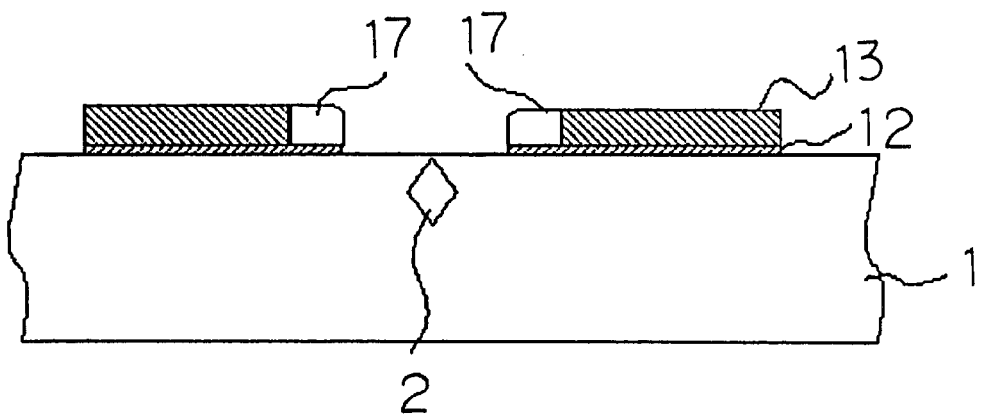
Figure 9:
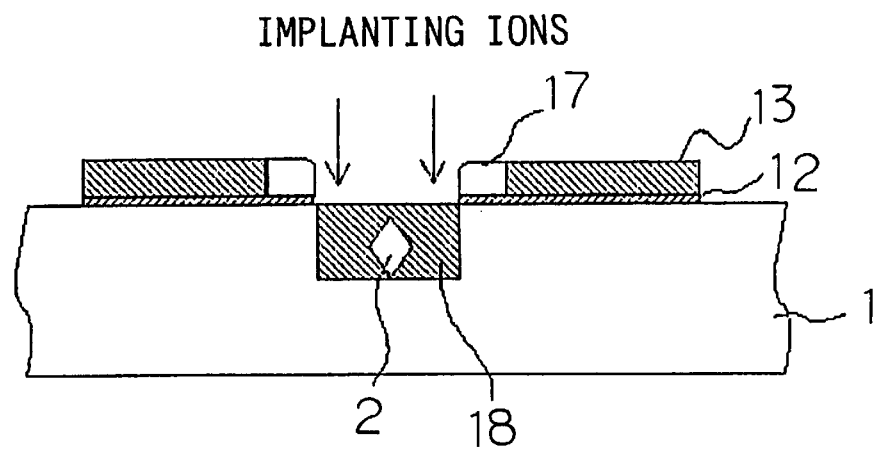
Figure 9:
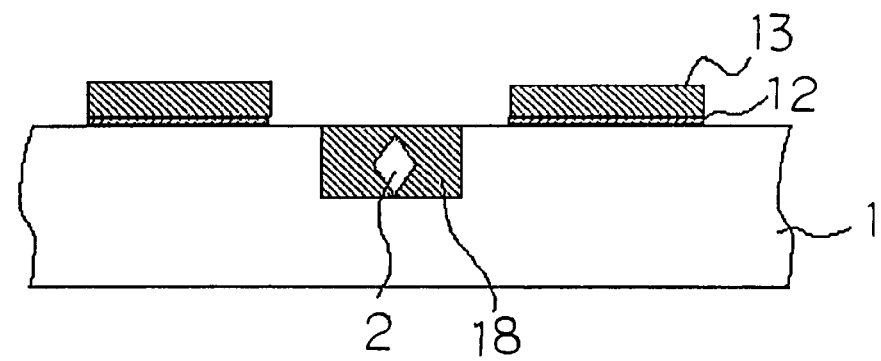
Figure 9:
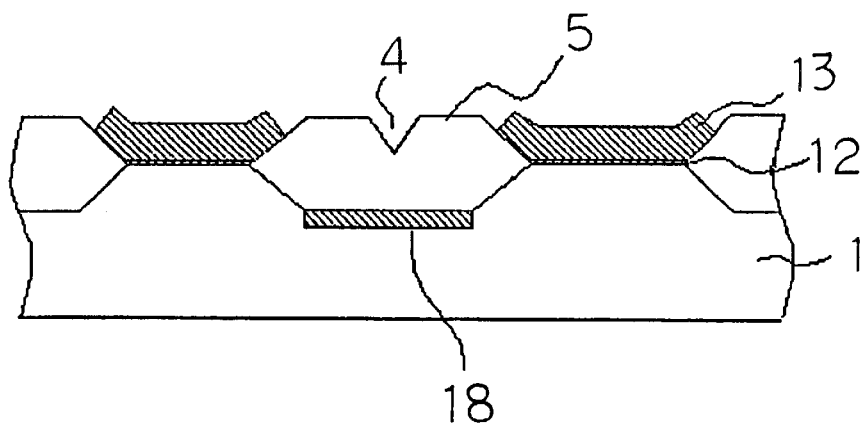
Figure 10:
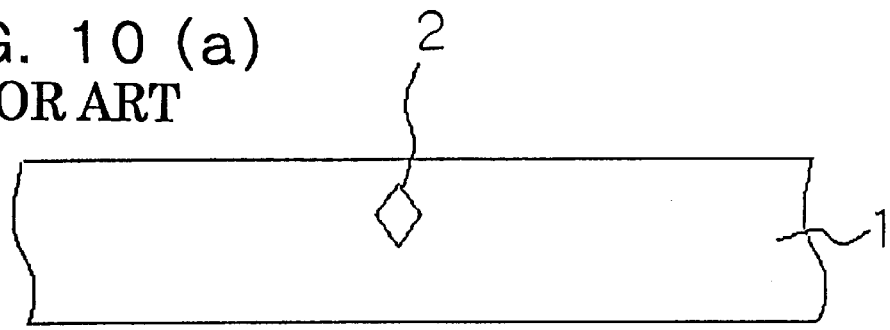
Figure 10:
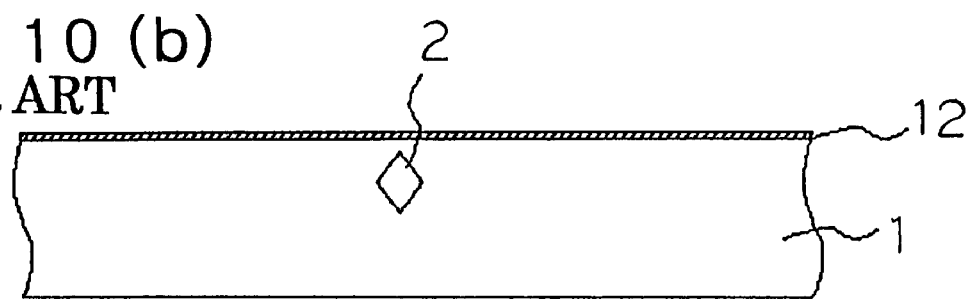
Figure 10:
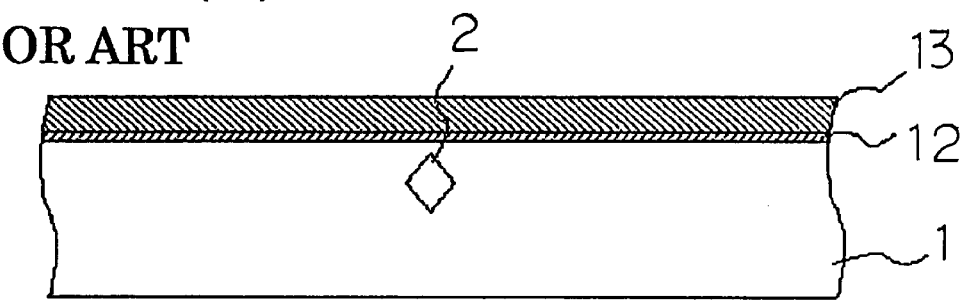
Figure 11:
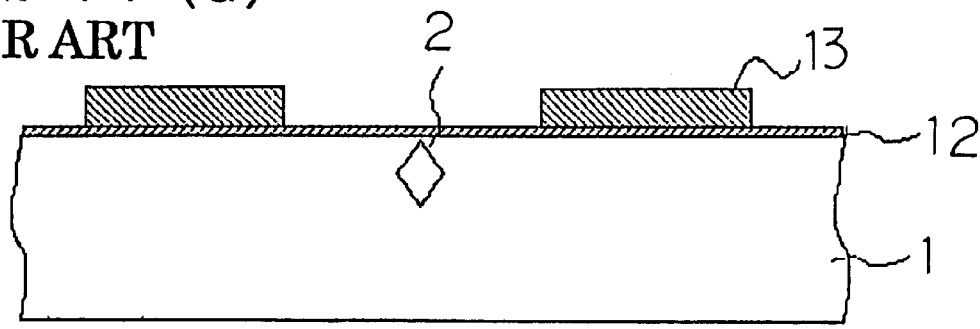
Figure 11:
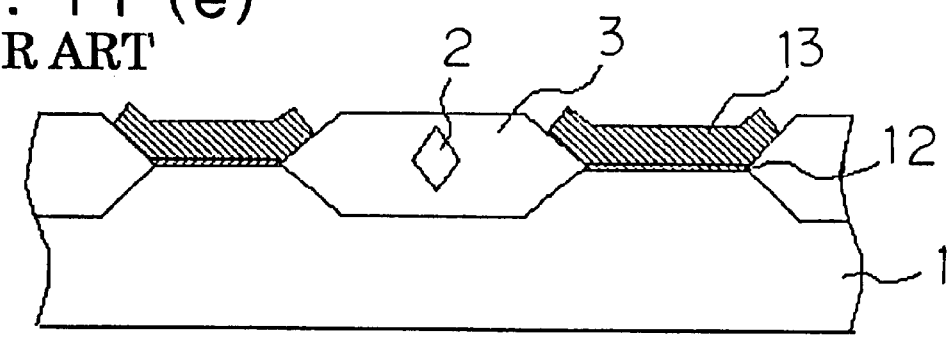
Figure 11:
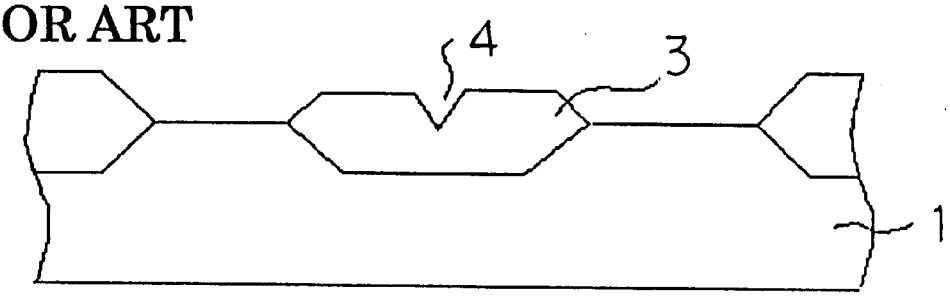
Figure 12G:
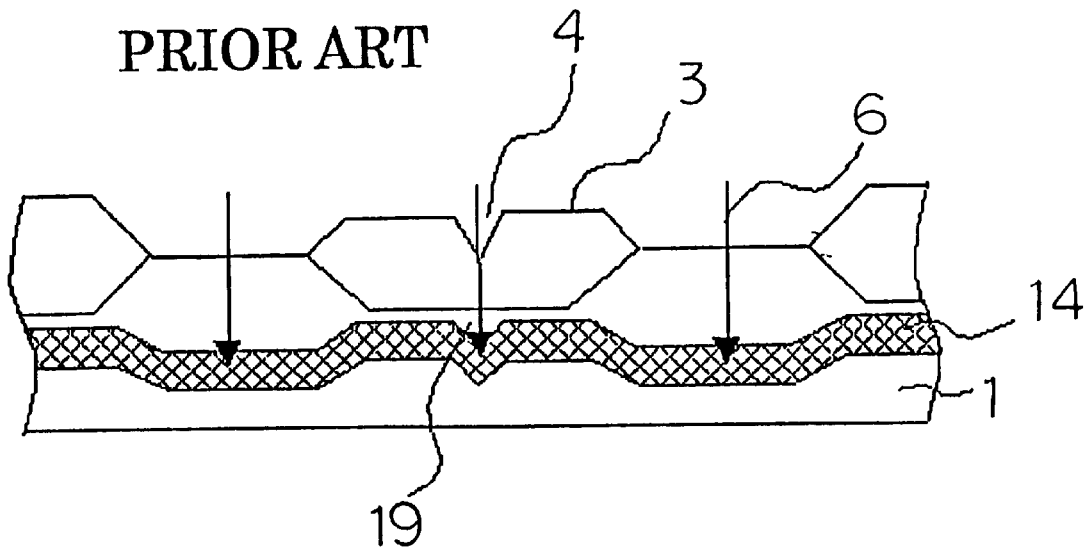
Figure 12H:
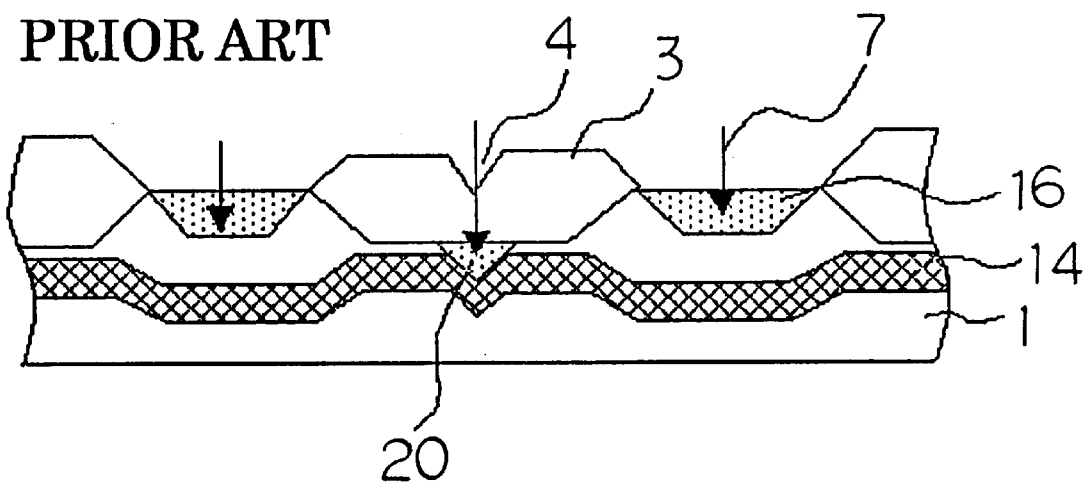

Referring to FIGS. 8 and 9, a fifth Example of the present invention is explained in detail. FIGS. 8 and 9 are cross-sectional views for illustrating, step by step, a portion of the manufacturing process for the semiconductor device according to the fifth Example of the present invention.

Referring to FIGS. 8 and 9, the method for producing the fifth embodiment of the present invention is explained. First, a thermally oxidized film 12 and a nitride film 13 are deposited on a silicon substrate 1 containing a crystal defect 2 (FIG. 8a) and etched selectively to a field pattern (FIG. 8b). An oxide film is then deposited on the entire surface, as shown in FIG. 8c, and is etched back by anisotropic etching to form a sidewall 17. Then, as shown in FIG. 9d, any one of silicon, germanium and argon is implanted to amorphousize at 18 the exposed portion of the silicon substrate 1. The oxidized sidewall 17 and the exposed thermally oxidized film 12 are then removed by oxidized film etching. Then, using the nitride film 13 as a mask, the field is selectively thermally oxidized at a temperature of 980° C. to 1100° C., as shown in FIG. 9f.

If the semiconductor device is fabricated by the above method, the oxidation rate is higher at the amorphousized region 18 of silicon than at the monocrystal region. Since silicon is amorphousized by implantation of silicon, germanium or argon, oxidation proceeds more speedily in the amorphousized region 18 than at the monocrystal region, so that the field oxide film 3 is increased in film thickness. On the other hand, since ions are not implanted below the sidewall oxide film 17, this region is not amorphousized. Since the rate of oxidation is not high at the LOCOS end, the bird's beak is not enlarged. The result is that, even if there exists the crystal defect 2 in the field, the field oxide film 3 can be increased in the film thickness without increasing the bird's beak at the field end. Thus, even if there exists a crystal defect 2 in the field region, there is no risk of formation of the low concentration region of channel stop layer in a region directly below the field oxide film by channel stop implantation as shown in FIG. 9f.

In the present Example, ions of silicon, germanium or argon is implanted in amorphousizing the exposed surface of the silicon substrate 1. However, the ions to be implanted are not limited to these ions. For example, the rate of oxidation can be raised by implanting boron or phosphorus up to a high concentration to increase the field oxide film only at the implanted portion.

According to the present invention, as described above, the following merits are achieved.

The first effect of the present invention is that, by etching the oxide film and forming the oxide film after LOCOS formation, no inversion layer is formed below the field oxide film, such that a semiconductor device can be produced which is free from inter-element leakage defects.

Specifically, by etching the field oxide film after LOCOS formation by a pre-set thickness to expose a crystal defect contained in the substrate and by forming the oxide film again, the oxide film is not excessively reduced in film thickness even if there exists the crystal defect in the crystal, while there is formed no low concentration region of channel stop layer below the field. Since no inversion layer is formed by implantation of the source/drain diffusion layer, there is no risk of lowering of the inter-element voltage withstanding properties.

The second effect of the present invention is that, by implanting the channel stop in two separate steps, it is possible to implant a sufficient amount of ions as a channel stop below the field oxide film to provide a semiconductor device which is free from inter-element leakage defects.

That is, by dividing the channel stop implantation in two stages, by reducing the energy for second channel stop implantation in comparison with that for the first channel stop implantation and by increasing the dosage in comparison with the implantation concentration for the formation of the source/drain diffusion layer, no inversion layer is formed following the drain implantation to avoid the inter-element leakage, even if the crosstalk defect is exposed by etching to a pre-set thickness of the field oxide film after LOCOS formation to reduce the thickness of the oxide film.

The third effect of the present invention is that, by carrying out the high-temperature heat treatment in a nitrogen atmosphere, the effective size of the crystal defect can be reduced to prevent the inter-element leakage.

That is, by carrying out high-temperature heat treatment in a nitrogen atmosphere before forming the nitride film at the time of field formation, following the nitride film or directly before the field oxidation step, inter-lattice oxygen in the crystal is diffused to form the oxide layer on the inner wall of the crystal defect (void) to reduce the size of or completely fill the void, with there being no recess in the field oxide film or the low concentration region of channel stop layer below the field.

The fourth effect of the present invention is that, by raising the silicon crystal ingot uplifting speed, the size of the crystal defect itself in the substrate can be diminished to prevent the inter-element leakage.

That is, by raising the uplifting speed of the silicon crystal ingot, the defect introduced into the crystal can be diminished, with there being no defect formed in the field oxide film or the low concentration region of channel stop layer below the field.

The fifth effect of the present invention is that, by implanting ions before LOCOS formation and following the formation of the sidewall oxide film on the inner surface of the nitride film, the field oxide film can be sufficiently increased in film thickness.

Specifically, one of silicon, argon, germanium, boron and phosphorus can be implanted in a mid portion of the field, silicon is amorphousized to permit oxidation to proceed from the monocrystal region easily to render it possible to increase the thickness of the field oxide film.

On the other hand, since no ions are implanted below the sidewall, the rate of oxidation of the LOCOS end is not raised to prevent the bird's beak from increasing in size. The result is that, even if there exists crystal defect in the field region, the field oxide film can be increased in film thickness without increasing the bird's beak at the field end region.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A method for producing a semiconductor device comprising:
   implanting predetermined ions in a portion of a substrate region destined for forming a thermally oxidized film to amorphousize a substrate region, and further forming a thermally oxidized film on the amorphousized region subsequently, to provide an oxide film increased in thickness selectively in said amorphousized substrate region.

2. The method for producing a semiconductor device as defined in claim 1 wherein said ions comprise at least one selected from the group consisting silicon, germanium, argon, boron and phosphorus ions.

3. A method for producing a semiconductor device comprising:
   implanting predetermined ions in a center region of a substrate destined for an oxide film for device isolation excluding an end portion destined to be a possible bird's beak to amorphousize a substrate, and
   subsequently forming the oxide film on the amorphized region for device isolation to provide an increased oxide film thickness only in a center region of the oxide film for device isolation.

4. The method for producing a semiconductor device as defined in claim 3 wherein the film thickness of the portion of the oxide film for device isolation corresponding to the amorphousized portion is set to a value which does not permit ions to travel to a substrate portion directly below the oxide film for device isolation at the time of ion implantation for forming an impurity layer.

5. The method for producing a semiconductor device as defined in claim 3 wherein said ions comprise at least one selected from the group consisting silicon, germanium, argon, boron and phosphorus ions.

6. A method for producing a semiconductor device comprising the steps of:
   (a) forming a nitride film in a pre-set region of a substrate containing a defect;
   (b) etching said pre-set region of the nitride film to form a pattern of nitride film;
   (c) depositing an oxide film to a pre-set thickness on the entire surface of the substrate;
   (d) forming a sidewall oxide film by etching off said oxide film to permit the oxide film to remain only on an inner side of an opening of said patterned nitride film constituting a field oxide film;
   (e) implanting predetermined ions, using said nitride film and the sidewall oxide film as a mask, to amorphousize an exposed portion of the substrate;
   (f) etching off said sidewall oxide film; and
   (g) forming an oxide film on the amorphized portion for device isolation by forming an oxide film, using said nitride film as a mask, so that the oxide film is increased in film thickness in said amorphousized portion.

7. The method for producing a semiconductor device as defined in claim 6 wherein the film thickness of the portion of the oxide film for device isolation corresponding to the amorphousized portion is set to a value which does not permit ions to travel to a substrate portion directly below the oxide film for device isolation at the time of ion implantation for forming an impurity layer.

8. The method for producing a semiconductor device as defined in claim 6 wherein said ions comprise at least one selected from the group consisting silicon, germanium, argon, boron and phosphorus ions.

* * * * *